(12) United States Patent
Feustel et al.

(10) Patent No.: US 8,198,147 B2
(45) Date of Patent: Jun. 12, 2012

(54) SUPERIOR FILL CONDITIONS IN A REPLACEMENT GATE APPROACH BY USING A TENSILE STRESSED OVERLAYER

(75) Inventors: Frank Feustel, Dresden (DE); Kai Frohberg, Niederau (DE); Thomas Werner, Moritzburg (DE)

(73) Assignee: GlobalFoundries, Inc., Grand Cayman (KY)

( * ) Notice: Subject to any disclaimer, the term of this patent is extended or adjusted under 35 U.S.C. 154(b) by 78 days.

(21) Appl. No.: 12/854,264

(22) Filed: Aug. 11, 2010

(65) Prior Publication Data

US 2011/0049640 A1   Mar. 3, 2011

(30) Foreign Application Priority Data

Aug. 31, 2009   (DE) .......................... 10 2009 039 521

(51) Int. Cl.
*H01L 21/00* (2006.01)

(52) U.S. Cl. ........ 438/153; 438/188; 438/199; 438/709; 438/723; 257/E27.062

(58) Field of Classification Search .................. 438/153, 438/188, 199, 709, 723
See application file for complete search history.

(56) References Cited

U.S. PATENT DOCUMENTS

| | | | |
|---|---|---|---|
| 2006/0286729 A1 | 12/2006 | Kavalieros et al. | 438/183 |
| 2008/0237737 A1* | 10/2008 | Chen et al. | 257/382 |
| 2008/0251851 A1* | 10/2008 | Pan et al. | 257/369 |
| 2009/0057769 A1 | 3/2009 | Wei et al. | 257/369 |
| 2009/0087974 A1* | 4/2009 | Waite et al. | 438/592 |

FOREIGN PATENT DOCUMENTS

| | | |
|---|---|---|
| DE | 102007041207 A1 | 3/2009 |
| DE | 102007046849 A1 | 4/2009 |

OTHER PUBLICATIONS

Translation of Official Communication from German Patent Office for German Patent Application No. 10 2010 039 521.0-33 dated Feb. 7, 2011.

* cited by examiner

*Primary Examiner* — Wai Sing Louie
(74) *Attorney, Agent, or Firm* — Williams, Morgan & Amerson, P.C.

(57) ABSTRACT

In a replacement gate approach for forming high-k metal gate electrodes in semiconductor devices, a tapered configuration of the gate openings may be accomplished by using a tensile stressed dielectric material provided laterally adjacent to the gate electrode structure. Consequently, superior deposition conditions may be achieved while the tensile stress component may be efficiently used for the strain engineering in one type of transistor. Furthermore, an additional compressively stressed dielectric material may be applied after providing the replacement gate electrode structures.

19 Claims, 4 Drawing Sheets

SUPERIOR FILL CONDITIONS IN A REPLACEMENT GATE APPROACH BY USING A TENSILE STRESSED OVERLAYER

BACKGROUND OF THE INVENTION

1. Field of the Invention

Generally, the present disclosure relates to the fabrication of sophisticated integrated circuits including transistor elements comprising gate structures on the basis of a high-k gate dielectric material in combination with a metal electrode material.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry including field effect transistors, CMOS technology is one of the most promising approaches due to the superior characteristics in view of operating speed and/or power consumption and/or cost efficiency. During the fabrication of complex integrated circuits using, for instance, CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, typically comprises so-called PN junctions that are formed by an interface defined by highly doped regions, referred to as drain and source regions, and a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially affects the performance of MOS transistors.

Presently, the vast majority of integrated circuits are based on silicon due to substantially unlimited availability, the well-understood characteristics of silicon and related materials and processes and the experience gathered during the last 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows performing subsequent high temperature processes, as are required, for example, for anneal cycles to activate dopants and to cure crystal damage without sacrificing the electrical characteristics of the interface.

For the reasons pointed out above, in field effect transistors, silicon dioxide has been preferably used as a base material of gate insulation layers that separate the gate electrode, frequently comprised of polysilicon or metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current, while also requiring enhanced capacitive coupling of the gate electrode to the channel region. Thus, the thickness of the silicon dioxide layer has to be correspondingly reduced to provide the required capacitance between the gate and the channel region. For example, a channel length of approximately 0.08 µm may require a gate dielectric made of silicon dioxide as thin as approximately 1.2 nm. Although, generally, usage of high speed transistor elements having an extremely short channel may be substantially restricted to high speed signal paths, whereas transistor elements with a longer channel may be used for less critical signal paths, such as storage transistor elements, the relatively high leakage current caused by direct tunneling of charge carriers through an ultra-thin silicon dioxide gate insulation layer may reach values for an oxide thickness in the range or 1-2 nm that may not be compatible with thermal design power requirements for performance driven circuits.

Therefore, replacing silicon dioxide based dielectrics as the material for gate insulation layers has been considered, particularly for extremely thin silicon dioxide based gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. It has thus been suggested to replace silicon dioxide with high permittivity materials such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

Additionally, transistor performance may be increased by providing an appropriate conductive material for the gate electrode so as to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance, while additionally maintaining leakage currents at an acceptable level. On the other hand, the non-polysilicon material, such as titanium nitride and the like, in combination with other metals, may be formed so as to connect to the high-k dielectric material, thereby substantially avoiding the presence of a depletion zone. Since the threshold voltage of the transistors, which represents the voltage at which a conductive channel forms in the channel region, is significantly determined by the work function of the metal-containing gate material, an appropriate adjustment of the effective work function with respect to the conductivity type of the transistor under consideration has to be guaranteed.

Providing different metal species for adjusting the work function of the gate electrode structures for P-channel transistors and N-channel transistors at an early manufacturing stage may, however, be associated with a plurality of difficulties, which may stem from the fact that a complex patterning sequence may be required during the formation of the sophisticated high-k metal gate stack, which may result in a significant variability of the resulting work function and thus threshold of the completed transistor structures. For instance, during a corresponding manufacturing sequence the high-k material may be exposed to oxygen, which may result in an increase of layer thickness and thus a reduction of the capacitive coupling. Moreover, a shift of the work function may be observed when forming appropriate work function metals in an early manufacturing stage, which is believed to be caused by a moderately high oxygen affinity of the metal species, in particular during high temperature processes which may typically be required for completing the transistor structures, for instance for forming drain and source regions and the like.

For this reason, in some approaches, the initial gate electrode stack may be provided with a high degree of compatibility with conventional polysilicon-based process strategies and the actual electrode metal and the final adjustment of the work function of the transistors may be accomplished in a very advanced manufacturing stage, i.e., after completing the basic transistor structure.

In a corresponding replacement gate approach, the polysilicon material acting as a sacrificial or placeholder material is removed after depositing at least a portion of the interlayer dielectric material by any appropriate etch techniques. Typically, the interlayer dielectric material may comprise stress-inducing dielectric layers in order to further enhance overall transistor performance. It is well known that a high strain component in the channel region of silicon-based transistors may result in a significant modification of the mobility of the charge carriers and thus of the overall conductivity of the channel region. For this reason a stress-inducing dielectric material may be placed in close proximity to the transistors in order to provide a desired strain component in the channel regions. Since P-channel transistors and N-channel transistors may require a different type of strain component, the stress-inducing dielectric materials may be provided with a different internal stress level in order to selectively enhance performance of N-channel transistors and P-channel transistors, respectively. The selective provision of an appropriately stressed dielectric material may be accomplished on the basis of a so-called "dual stress liner" approach in which a sequence of deposition and removal processes in combination with an appropriate masking regime is applied in order to position, for instance, a tensile stressed dielectric material above an N-channel transistor and a compressively stressed dielectric material above a P-channel transistor.

Although the above-described replacement gate strategy may be a promising approach, it turns out, however, that deposition-related irregularities may be created, in particular in P-channel transistors, the gate electrode structures of which may be embedded in the compressively stressed silicon nitride material. It is believed that the compressive stress of the silicon nitride material may result in a disadvantageous shape of the opening that is obtained after the removal of the polysilicon placeholder material. Consequently, upon depositing the materials required for the replacement gate, such as metals, high-k dielectric materials and the like, the cross-sectional shape of the opening affected by the surrounding compressively stressed dielectric material may result in corresponding irregularities, such as voids and the like, in particular when an electrode metal is to be filled into the opening. Consequently, in particular in sophisticated semiconductor devices, in which a gate length of approximately 40 nm and less with a gate height of approximately 80-100 nm may be required, the disadvantageous influence of the compressively stressed dielectric material may result in significant yield loss due to voids or any other deposition irregularities in the gate electrode structures.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which a placeholder material of a gate electrode structure may be replaced by a metal-containing electrode material in an advanced manufacturing stage, wherein a tensile stressed dielectric material, that may laterally enclose the gate electrode structures of any type of transistors, may result in a superior cross-sectional shape of an opening that is formed after the removal of the placeholder material. That is, due to the tensile stress of the adjacent dielectric material, a tapered cross-sectional shape of the resulting opening may be obtained, which thus has an increased lateral dimension at the top of the opening compared to the bottom, thereby enabling a reliable filling in of any appropriate material, such as high-k dielectrics if required, metal-containing electrode materials and the like. On the other hand, the tensile stressed dielectric material may also result in a superior transistor performance of, for instance, N-channel transistors, while a negative effect on P-channel transistors may be reduced by modifying the intrinsic stress level of the tensile stressed dielectric material above the P-channel transistor by removing the material, by providing an additional compressively stressed dielectric material and the like. In this manner, an efficient strain-inducing mechanism may be implemented, such as a modified dual stress liner approach, while nevertheless providing superior deposition conditions when refilling the opening in the gate electrode structure.

One illustrative method disclosed herein comprises forming a tensile stressed dielectric layer above and adjacent to a first gate electrode structure of a first transistor and above and adjacent to a second gate electrode structure of a second transistor, wherein the first and second gate electrode structures comprise a placeholder material. The method additionally comprises removing a first portion of the tensile stressed dielectric layer above the first and second gate electrode structures so as to expose a top surface of the placeholder material, while a second portion of the tensile stressed dielectric material is maintained laterally adjacent to the first and second gate electrode structures. Moreover, the method comprises replacing the placeholder material with one or more metal materials in the first and second gate electrode structures in the presence of the second portion. Additionally, the method comprises forming a compressively stressed dielectric layer above the second gate electrode structure after replacing the placeholder material.

A further illustrative method disclosed herein comprises forming a tensile stressed dielectric material so as to laterally enclose a gate electrode structure of a transistor and to expose a top surface of a placeholder material of the gate electrode structure. Furthermore, the method comprises removing the placeholder material in the presence of the tensile stressed dielectric material in order to form a tapered opening in the gate electrode structure. The method additionally comprises filling the opening with one or more materials, at least one of which represents a metal-containing electrode material. Additionally, the method comprises reducing a strain-inducing effect of the tensile stressed dielectric material on the transistor.

One illustrative semiconductor device disclosed herein comprises a gate electrode structure of a transistor formed above a semiconductor region. The gate electrode structure comprises a gate insulation layer including a high-k dielectric material and also comprises an electrode material that is formed on the gate insulation layer and has a tapered cross-sectional configuration. The semiconductor device further comprises a dielectric material formed above the gate electrode structure and having an internal compressive stress level so as to induce a compressive strain in a channel region of the transistor.

BRIEF DESCRIPTION OF THE DRAWINGS

The disclosure may be understood by reference to the following description taken in conjunction with the accompanying drawings, in which like reference numerals identify like elements, and in which.

Figure 1A:
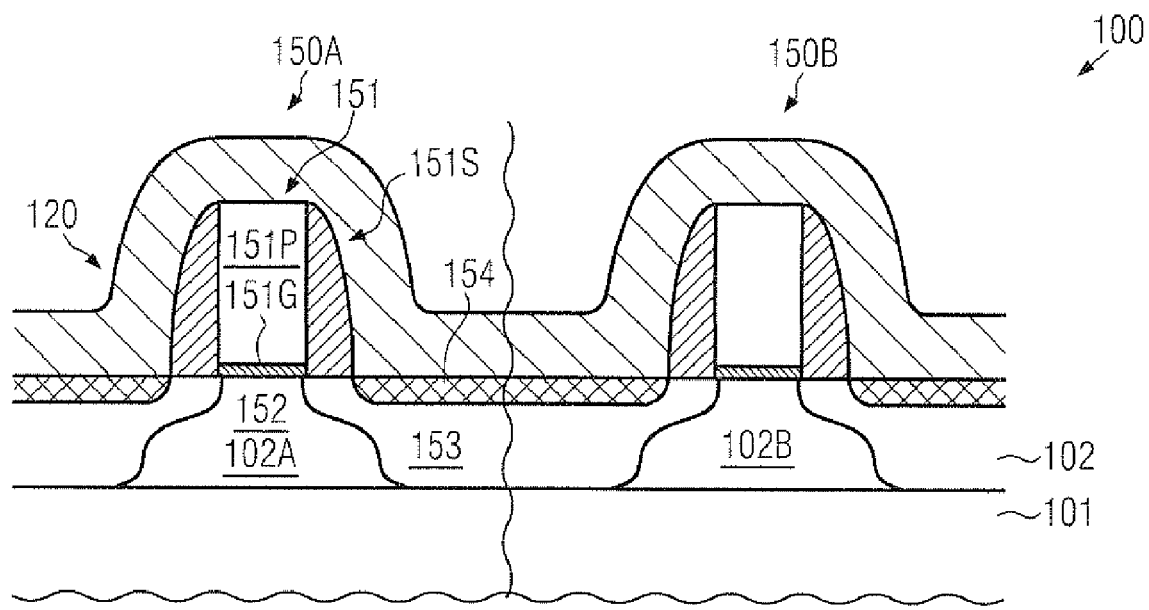
FIGS. 1a-1f schematically illustrate cross-sectional views of a semiconductor device during various manufacturing stages in which a gate placeholder material may be replaced in an advanced manufacturing stage on the basis of superior cross-sectional shapes of respective gate openings caused by a tensile stressed dielectric material, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which the refilling of an opening in gate electrode structures may be performed on the basis of a superior cross-sectional shape of the opening for any type of transistor, thereby substantially avoiding deposition-related irregularities, such as voids, as may frequently be encountered in sophisticated semiconductor devices in which metal gate electrodes may be provided in combination with a dual stress liner approach. The superior cross-sectional shape of the gate opening may be obtained by providing a tensile stressed dielectric material above the transistor elements and thus laterally adjacent to the gate electrode structure prior to removing the placeholder material, thereby avoiding the presence of a compressively stressed dielectric material adjacent to gate electrode structures, as may be the case in conventional replacement gate approaches performed after the provision of differently stressed dielectric materials. Consequently, upon removing the placeholder material, the tensile stressed dielectric material may act on the sidewalls of the resulting opening, thereby obtaining a tapered cross-sectional shape, which is to be understood as a shape in which a width at the bottom of the gate opening may substantially correspond to the initially created gate length, while the lateral extension at the top portion of the gate opening may be increased. Due to this tapered shape, i.e., the initial gate length at the bottom and an increased "gate length" at the top of the gate opening, superior deposition conditions may be provided, in particular if gate electrode structures of a designed gate length of approximately 40 nm and less are considered. Additionally, the tensile stressed dielectric material may result in an improvement of transistor performance for one type of transistor, such as N-channel transistors, whereas any negative effect of the tensile stressed dielectric material on the other type of transistor may be compensated for, or at least significantly reduced, by providing a compressively stressed dielectric material, wherein, depending on the overall process strategy, in some illustrative embodiments, the tensile stress level may be selectively relaxed prior to the deposition of the compressively stressed dielectric material. In other cases, if desired, the tensile stressed dielectric material may be selectively replaced with a compressively stressed dielectric material so that a modified dual stress liner approach may result in superior strain conditions in any type of transistor. Consequently, a gradual and uniform tapered cross-sectional shape may be obtained for the gate openings of each type of transistor without requiring sophisticated patterning strategies, for instance by applying specifically designed etch techniques during the patterning of the gate layer stack, which may result in a significantly more complex overall process flow. Thus, the replacement gate approach may be efficiently combined with efficient strain-inducing mechanisms based on stressed dielectric materials, which may enable a further device scaling without contributing to increased yield losses.

FIG. 1a schematically illustrates a cross-sectional view of a semiconductor device 100 comprising a substrate 101, such as a semiconductor substrate, an insulating substrate and the like, above which may be formed a semiconductor layer 102. The semiconductor layer 102 may be comprised of silicon, possibly in combination with other species, such as germanium, carbon and the like, as may be required for forming therein and thereabove circuit elements such as transistors 150A, 150B and the like. As previously indicated, crystalline silicon-based semiconductor materials may preferably be used for sophisticated complex circuitry wherein the electronic characteristics, such as charge carrier mobility and the like, may be efficiently modified on the basis of creating a specific strain locally in the semiconductor layer 102, as previously discussed. The semiconductor layer 102 may have any appropriate thickness, for instance from several nanometers to a hundred nanometers and more, depending on the overall configuration of the semiconductor device 100. For example, in sophisticated silicon-on-insulator (SOI) devices, a buried insulating material (not shown) may be formed directly below the semiconductor layer 102, wherein a thickness of sophisticated fully depleted transistor elements may be several nanometers. In other cases, the substrate 101 and the semiconductor layer 102 may represent a bulk configuration in which the crystalline semiconductor material may extend into the depth of the substrate 101, which may be significantly greater compared to a vertical extension of the transistor elements 150A, 150B. Furthermore, it should be appreciated that the semiconductor layer 102 may comprise any appropriate isolation structures (not shown) in order to appropriately laterally delineate semiconductor regions or active regions, such as regions 102A, 102B, which are to be understood as semiconductor regions having formed therein one or more PN junctions, for instance in the form of source and drain regions 153, which form a PN junction with a channel region 152 laterally enclosed by the drain and source regions 153. In the example shown, the transistors 150A, 150B may represent transistors of different conductivity type so that the drain and source regions 153 may be formed on the basis of dopant species of different type wherein, for convenience, any such differences are not shown in FIG. 1a. Furthermore, in order to reduce overall contact resistivity of the drain and source regions 153, frequently, metal silicide regions 154 may be provided in a portion of the drain and source regions 153. The transistors 150A, 150B may further comprise a gate electrode structure 151 comprising a gate insulation layer 151G that separates an "electrode" material 151P from the channel region 152. As previously indicated, in a replacement gate approach, at least a significant portion of the electrode material 151P, which will also be referred to as placeholder material, may be removed and replaced by a highly conductive material, such as a metal and the like. In some approaches, the gate insulation layer 151G, or at least a portion thereof, may also be removed in a further advanced manufacturing stage in order to provide a high-k dielectric material, while in other approaches the gate insulation layer 151G may already comprise a high-k dielectric material, possibly in combination with a conductive cap material that may provide superior conductivity and that may reliably protect the sensitive high-k dielectric material of the gate insulation layer 151G during the process sequence for forming the transistors 150A, 150B and during the process sequence for replacing the placeholder material 151P. For convenience, any such conductive cap layer materials are not shown in FIG. 1a. Furthermore, as previously indicated, in some approaches, a work function adjusting species may have been incorporated into the material 151P and/or the material 151G, if considered appropriate, while in other cases any such work function adjusting metal species may be provided upon replacing the placeholder material 151p.

Furthermore, the gate electrode structure 151 may comprise a spacer structure 151S, for instance formed on the basis of a silicon nitride material in combination with a silicon dioxide etch stop liner (not shown), while in other cases any other appropriate configuration of spacer elements and etch stop liners may be applied. Furthermore, in some cases, the spacer structure 151S, or at least a portion thereof, may be removed in this manufacturing stage if considered appropriate, for instance in view of enhancing the overall strain-inducing efficiency of a dielectric material 120, which may be formed above the active regions 102A, 102B and above the corresponding gate electrode structures 151. In the embodiment shown in FIG. 1a, the dielectric layer 120 may be provided with an intrinsic tensile stress level, which may result in superior strain conditions in one of the transistors 150A, 150B, for instance in the transistor 150A when representing an N-channel transistor, while the corresponding tensile component may negatively affect performance of the transistor 150B and may be compensated for or even overcompensated for in a later manufacturing process. The dielectric layer 120 may have any appropriate thickness, as may be required in view of the overall geometric configuration of the device 100. That is, for sophisticated semiconductor devices comprising circuit elements having critical dimensions of approximately 40 nm and less, a complex surface topography may be created, in particular in densely packed device regions. For example, the gate electrode structures 151 may have a height of approximately 50-100 nm and higher, while a length, i.e., in FIG. 1a, the horizontal extension of the placeholder material 151P, may be 40 nm and less. Consequently, for closely spaced gate electrode structures and thus conductive lines, corresponding spacings of approximately 100 nm and less may be created, thereby requiring sophisticated deposition techniques in order to avoid deposition-related irregularities, such as the creation of voids in the dielectric material of the layer 120 and any material that has to be formed thereon.

The semiconductor device 100 as illustrated in FIG. 1a may be formed on the basis of any appropriate process strategy for defining the active regions 102A, 102B, for instance by providing appropriate isolation structures, such as shallow trench isolations, in combination with implantation processes performed on the basis of corresponding masking regimes so as to define the basic conductivity type and dopant level in the active regions 102A, 102B. Thereafter, the gate electrode structures 151 may be formed by providing an appropriate layer stack and patterning the same, which may require highly sophisticated process techniques for forming appropriate materials, such as high-k dielectric materials, if provided in this manufacturing stage, in combination with conventional dielectrics, such as silicon oxide-based materials and the like, followed by further materials such as a conductive cap layer, if required, and the like, and the placeholder material 151P. Furthermore, additional dielectric cap materials and the like may typically be provided in this manufacturing stage as is required for the further processing of the device 100. Based on complex lithography and patterning strategies, the gate electrode structures 151 may be formed and the further processing may be continued by forming the drain and source regions 153 in combination with the spacer structure 151S in order to obtain the desired vertical and lateral dopant profile for the regions 153. It should be appreciated that additional strain-inducing mechanisms may be implemented, for instance in the form of an embedded semiconductor alloy in one or both of the transistors 150A, 150B, if required. For example, prior to completing the drain and source regions 153 and prior to forming the spacer structure 151S, corresponding cavities may be formed in one or both of the active regions 102A, 102B and these cavities may be refilled with a strain-inducing semiconductor alloy, such as a silicon/germanium alloy and the like. For example, a plurality of appropriate process strategies are well established so as to form a compressive strain-inducing semiconductor alloy in the active regions of P-channel transistors. Next, any anneal processes may be performed in order to activate the dopants in the drain and source regions 153 and to re-crystallize implantation-induced damage. Subsequently, the metal silicide regions 154 may be formed by applying any appropriate process regime, wherein, depending on the overall process strategy, the placeholder material 151P may have an appropriate configuration in order to avoid a silicidation thereof. For instance, the placeholder material 151P may comprise an appropriate cap layer, such as a silicon nitride material and the like. Thereafter, the dielectric layer 120 may be formed, for instance by plasma enhanced chemical vapor deposition (CVD) techniques in which the process parameters may be appropriately selected on the basis of well-established recipes in order to obtain the desired material composition and thus the desired intrinsic tensile stress level. For example, silicon nitride-based materials may be deposited with a high compressive stress level of approximately 3 GPa and even higher, and also a high tensile stress level of 1 GPa and significantly higher may be achieved upon selecting appropriate process parameters. For instance, by incorporating a more or less pronounced amount of hydrogen into the silicon nitride-based material, the internal stress level may be efficiently adjusted. Furthermore, a thickness of the layer 120, which may range from approximately ten to several tenths of nanometers, may be appropriately selected in order to obtain the desired conformal deposition behavior for the surface topography under consideration. In the embodiment shown, the dielectric layer 120 may be formed "directly" on the transistors 150A, 150B, i.e., on the metal silicide regions 154, and may be directly in contact with the spacer structure 151S and the placeholder material 151P. In this case, a very efficient transfer of the stress component into the channel region 152 may be accomplished. In other cases, a further material layer, for instance in the form of a silicon dioxide material and the like, may be provided (not shown) so as to act as an etch stop material during a later manufacturing stage when a portion of the material 120 is to be removed from above one of the transistors 150A, 150B, such as the transistor 150B, for which the intrinsic tensile stress level may be considered inappropriate for obtaining high performance.

Figure 1B:
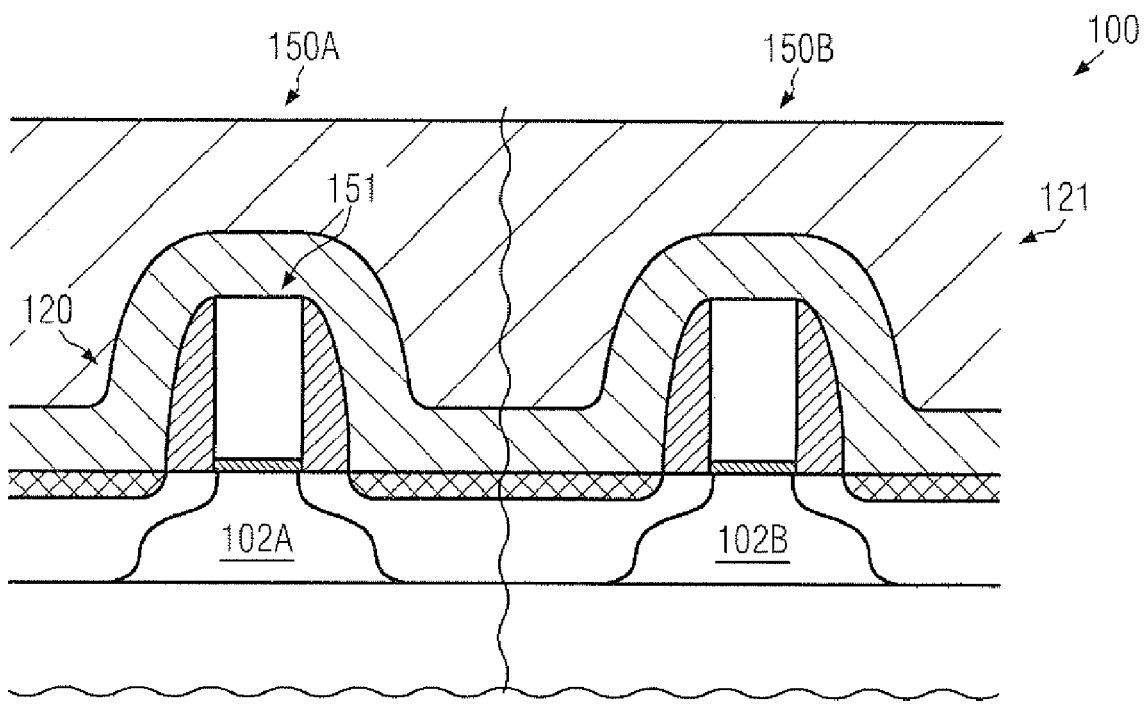

FIG. 1b schematically illustrates the semiconductor device 100 in a further advanced manufacturing stage in which a fill material 121 may be formed above the tensile stressed dielectric layer 120 in order to fill spaces between adjacent gate electrode structures 151 and other circuit elements. The fill material 121 may represent any appropriate material, such as a polymer material, a conventional dielectric material such as silicon dioxide and the like, which may be deposited with a high degree of gap filling capability in order to avoid deposition-related irregularities. For example, silicon dioxide material may be provided on the basis of well-established deposition techniques such as sub-atmospheric CVD, high density plasma assisted CVD and the like, thereby reliably filling the spaces of even very sophisticated device geometries. If desired, the fill material 121 may be planarized, for instance by chemical mechanical polishing (CMP) and the like, in order to provide a substantially planar surface that may result in superior conditions for the further processing of the device 100. In some illustrative embodiments, the fill material 121 may be provided in the form of a tensile stressed dielectric material, which may, for instance, be accomplished by depositing a silicon dioxide material and treating the same so as to obtain a tensile stressed level. In further illustrative embodiments, the dielectric layer 120 may be provided with any appropriate material composition and with any desired intrinsic stress level, such as a tensile stress level or a substantially neutral stress level, whereas the desired tensile stress may be provided by the fill material 121. For example, the layer 120 may be provided in the form of a very efficient etch stop material, which may reliably protect the device 100 during the further processing, for instance during the removal of the fill material 121 and during the deposition and patterning of further stress-inducing dielectric materials above the transistors 150A, 150B.

Figure 1C:
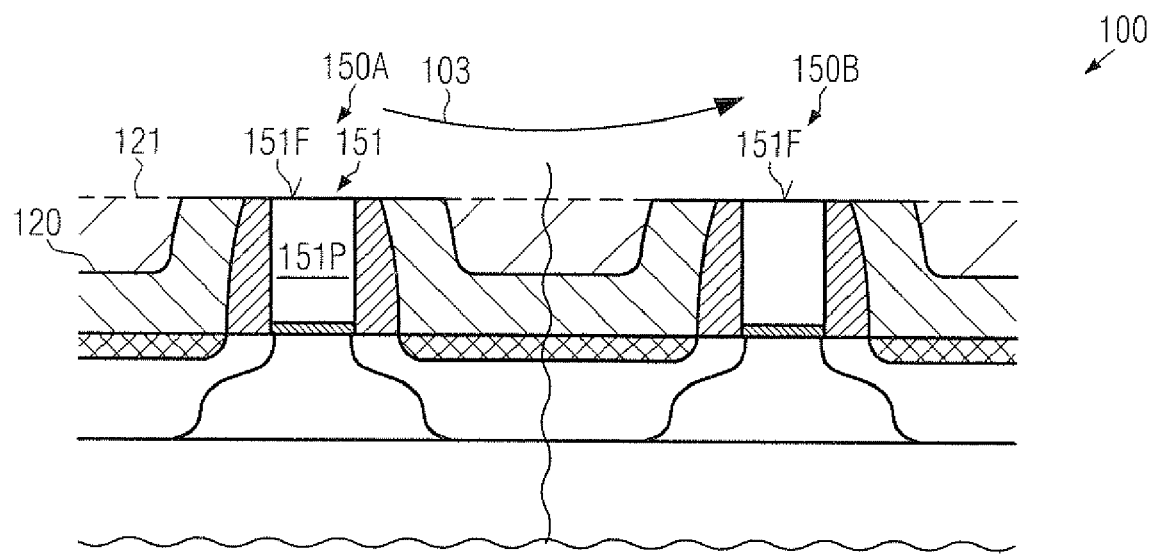

FIG. 1c schematically illustrates the semiconductor device 100 during a removal process 103, such as a CMP process, an etch process or any combination thereof, during which a top surface 151F of the placeholder material 151P may be exposed in the gate electrode structures 151. For example, the removal process 103 may be provided in the form of a CMP process for planarizing the fill material 121, wherein a selective CMP recipe may be applied so as to stop on the layer 120. Thereafter, a further non-selective CMP recipe may be used in order to commonly remove portions of the material layers 121 and 120, thereby exposing the surface 151F. It should be appreciated that other techniques may be used, for instance an etch process, possibly in combination with a CMP process, depending on the selected process strategy. Furthermore, if desired, the removal process 103 may comprise a selective etch process for removing the fill material 121 when the presence thereof is considered inappropriate for the further processing. In other cases, the fill material 121 may be maintained so as to provide superior process conditions during the further processing, i.e., the removal of the placeholder material 151P and the subsequent deposition of one or more electrode materials, as will be described later on in more detail.

Figure 1D:
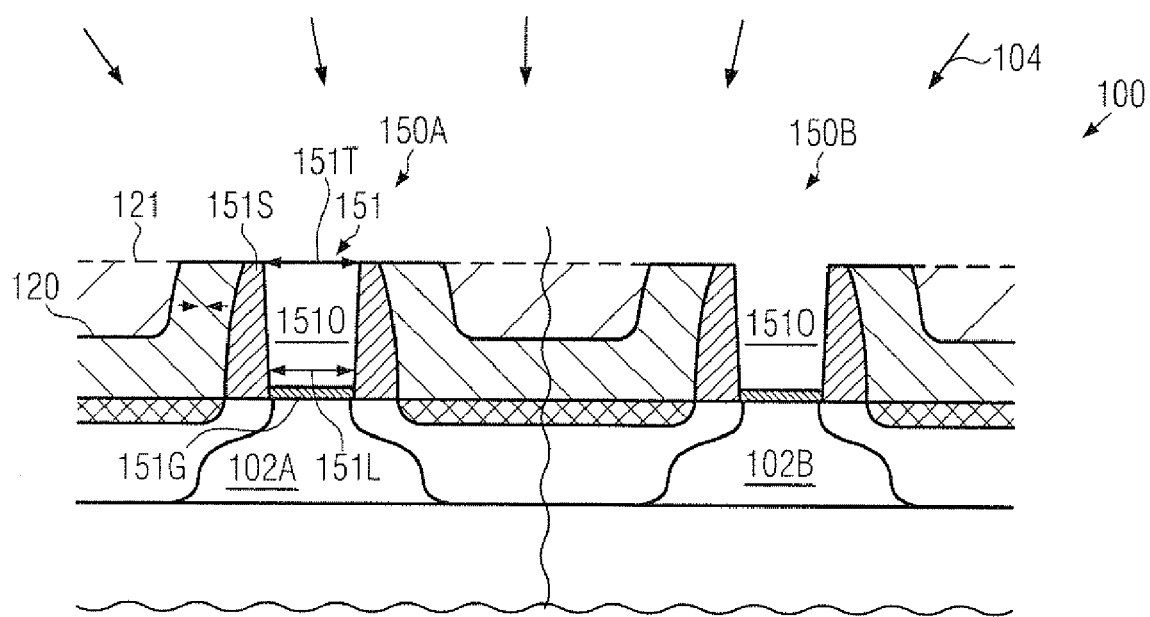

FIG. 1d schematically illustrates the semiconductor device 100 when exposed to an etch ambient 104, which may be applied on the basis of appropriate process conditions so as to remove the placeholder material 151P (FIG. 1c) selectively to the spacer structure 151S, the dielectric layer 120 and the fill material 121, if still present. For this purpose, any appropriate etch recipes may be used, such as wet chemical etch recipes for removing silicon material selectively with respect to silicon nitride and silicon dioxide-based materials, which may be accomplished on the basis of TMAH (tetra methyl ammonium hydroxide), which exhibits a high etch rate for silicon material with a high selectivity with respect to silicon nitride and silicon dioxide and also other materials such as titanium nitride and the like. In other cases, other hydroxide solutions may be applied in order to efficiently remove a silicon material selectively with respect to silicon nitride and silicon dioxide. Also, plasma assisted etch recipes may be applied since highly selective recipes for removing silicon selectively to silicon dioxide and the like are available. Consequently, during the etch process 104, an opening 151O may be formed in the gate electrode structures 151, wherein the opening 151O may extend down to the gate insulation layer 151G, possibly in combination with a conductive cap material, when the high-k dielectric material has been provided in an earlier manufacturing stage upon patterning the gate electrode structures 151. In other cases, the gate insulation layer 151G, or at least a portion thereof, may also be removed during the process sequence 104 when a high-k dielectric material is to be deposited in a subsequent manufacturing stage.

Upon forming the opening 151O, the tensile stress component in the layer 120 and/or in the fill material 121, if still present, may significantly affect the cross-sectional shape of the gate electrode structure 151, thereby generating a tapered cross-sectional shape, which is to be understood that, at least in a length direction, i.e., in FIG. 1*d*, the horizontal direction, an increased lateral dimension 151T at the top of the opening 151O is obtained. That is, the mechanical effect of the tensile stress component may result in a significantly more pronounced response of the remaining gate electrode structure 151 compared to the bottom of the opening 151O in which the initial gate length 151L may be substantially maintained due to the adhesion to the underlying active regions 102A, 102B.

Figure 1E:
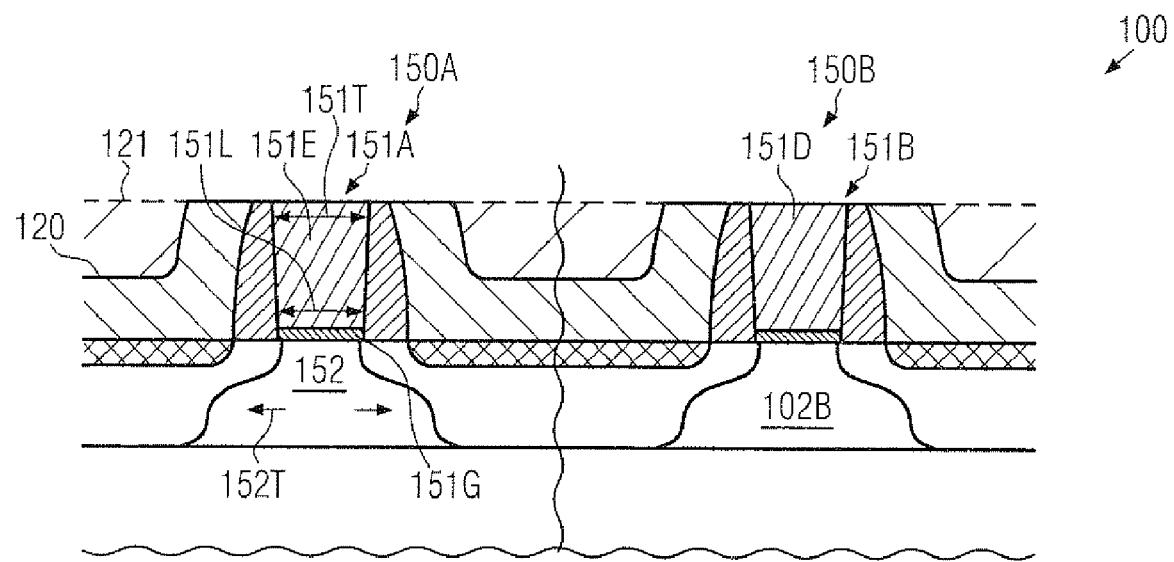

FIG. 1*e* schematically illustrates the semiconductor device 100 in a further advanced manufacturing stage. As illustrated, a gate electrode structure 151A may be formed in the transistor 150A and may comprise one or more appropriate electrode materials 151E in order to obtain the desired work function and thus threshold of the transistor 150A in combination with a high capacitive coupling based on the gate insulation layer 151G, which may comprise a high-k dielectric material, as previously explained. Similarly, the transistor 150B may comprise a gate electrode structure 151B comprising one or more electrode materials 151D in order to provide the required work function and thus threshold voltage for the transistor 150B. It should be appreciated that the gate electrode structures 151A, 151B may comprise a high-k dielectric material adjacent to or within the electrode materials 151E, 151D, depending on the overall process strategy, for instance if a high-k dielectric material has to be provided in this manufacturing stage. Furthermore, conductive barrier materials or etch stop materials may be required for providing different types of metal species in the gate electrode structures 151A, 151B, depending on the selected process strategy. For convenience, any such details are not shown in FIG. 1*e*.

The gate electrode structures 151A, 151B may be formed on the basis of any appropriate process strategy, wherein, however, at any rate, the tapered configuration of the opening 151O (FIG. 1*d*) provides superior deposition conditions for forming any type of material layer, such as a high-k dielectric material layer, etch stop or barrier layers, and in particular for filling in an appropriate metal material. For example, one or more materials may be deposited first in order to adjust the desired work function for the gate electrode structure 151A, wherein a corresponding etch stop material may then be patterned in order to enable an efficient removal of these materials from the gate electrode structure 151B, which may subsequently receive an appropriate metal species for adjusting the desired gate characteristics. If required, a further metal material may be deposited. Consequently, during the various deposition and also removal processes, the previously obtained superior tapered configuration may result in superior process uniformity and thus reliability in adjusting the desired transistor characteristics. Furthermore, any excess materials previously deposited may be efficiently removed by, for instance, CMP when the fill material 121 is still in place, while in other cases appropriate masking regimes and etch strategies may be applied. Consequently, the gate electrode structures 151A, 151B may represent sophisticated metal-containing gate structures with a high-k dielectric material provided in the gate insulation layer 151G, wherein the electrode materials 151E, 151D may have a tapered cross-sectional configuration according to the different length dimensions 151T at the top and 151L at the bottom of the gate electrode structures 151A, 151B. Hence, the length 151L may represent the actual gate length and may substantially correspond to the desired design gate length. Moreover, the material 120 and/or the material 121 may induce a desired tensile strain component 152T in the channel region 152 of the transistors 150A, 150B.

Figure 1F:
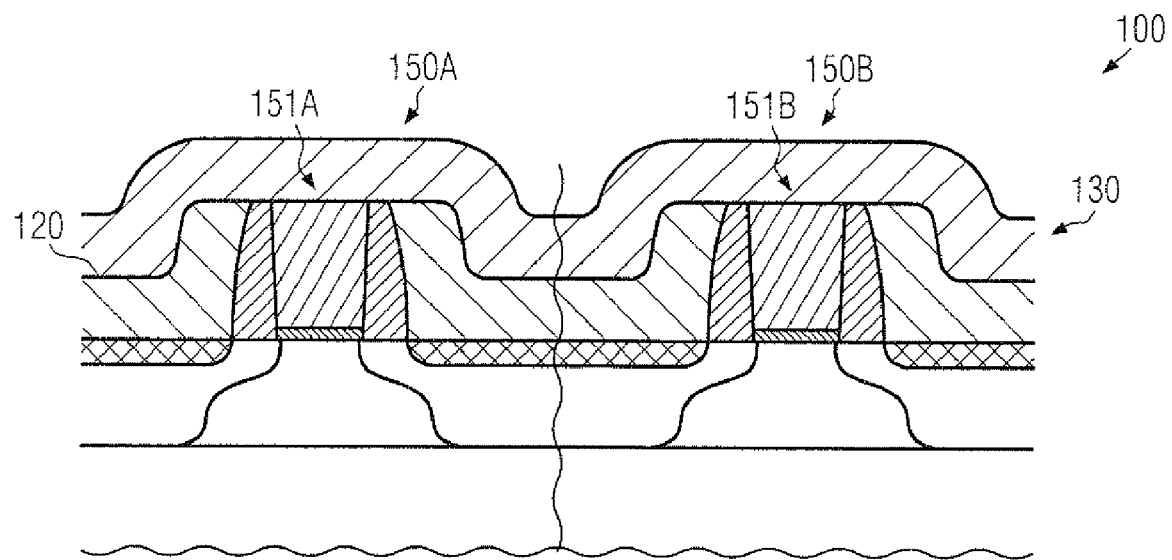

FIG. 1*f* schematically illustrates the semiconductor device 100 wherein a further dielectric layer 130 may be formed above the transistors 150A, 150B with a desired high compressive stress level. In the embodiment shown, the dielectric layer 130 may be formed above the material 120 after removing the fill material 121 (FIG. 1*e*), while in other cases (not shown) the layer 130 may be provided on the basis of the device configuration as shown in FIG. 1*e*, i.e., the layer 130 may be formed above the fill material 121. As previously discussed, silicon nitride-based materials, nitrogen-containing silicon carbide materials and the like may be formed with a high intrinsic compressive stress level, which may thus compensate for or even over-compensate for the stress level of the layer 120, for instance in the transistor 150B, whereas, in the transistor 150A, the stress level may be modified, as will be explained later on in more detail, while in other cases the material 130 may be selectively removed from above the transistor 150A. Consequently, an efficient strain adjustment for both transistors 150A, 150B may be accomplished on the basis of the materials 120 and 130 without unduly affecting the process of forming the replacement gates 151A, 151B. In other illustrative embodiments (not shown), the layer 120 may represent a substantially stress neutral material, as also previously discussed, and the strain mechanism may be implemented on the basis of the material 130 in combination with a further stress-inducing material, thereby implementing a dual stress liner approach, which may be performed on the basis of the material 120 acting as an efficient etch stop material. On the other hand, the desired superior shape of the electrode structures 151A, 151B may have been achieved on the basis of the fill material 121 (FIG. 1*e*), which may be provided with a desired tensile stress level.

Figure 1G:
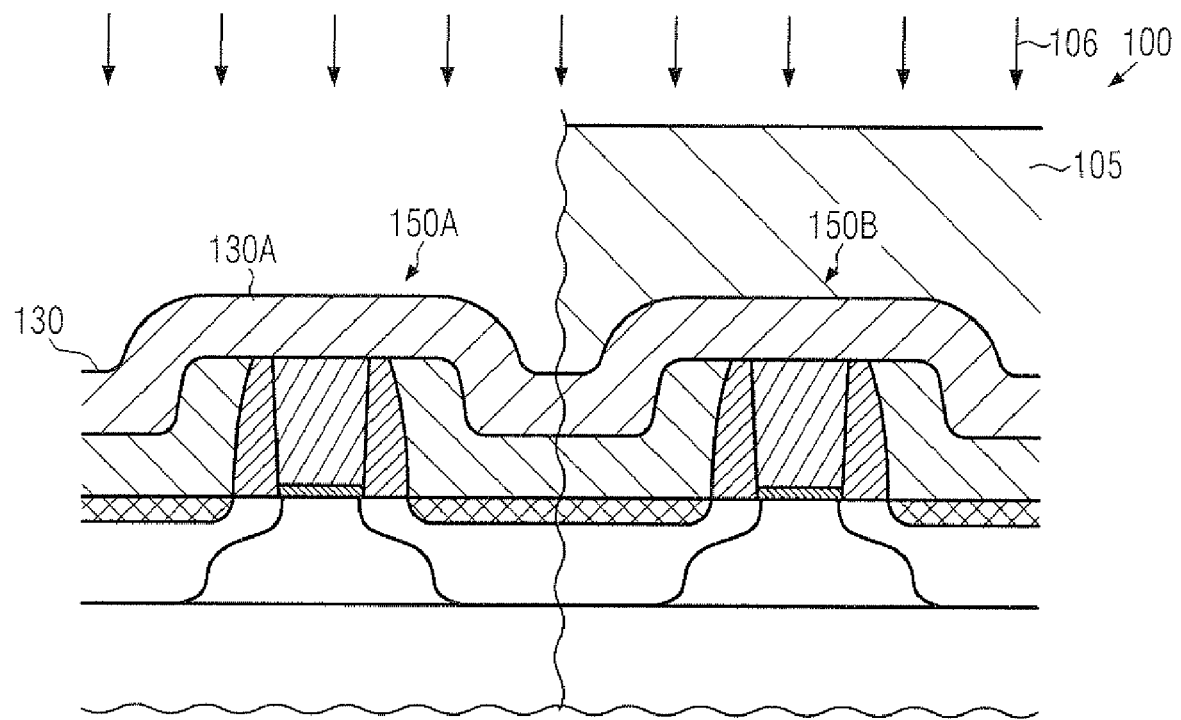
FIG. 1g schematically illustrates a cross-sectional view of the semiconductor device in a further advanced manufacturing stage in which a compressively stressed dielectric material may be selectively modified in its initial stress level, according to further illustrative embodiments.

FIG. 1*g* schematically illustrates the semiconductor device 100 in a further advanced manufacturing stage in which a mask 105, such as a resist mask, may be provided in order to cover the layer 130 above the transistor 150B while exposing a portion 130A of the layer 130 above the transistor 150A. Moreover, the device 100 may be exposed to a stress relaxation process 106, for instance performed as an ion implantation process, thereby significantly reducing the intrinsic stress level of the portion 130A. For example, the process 106 may be based on an ion bombardment using species such as xenon, germanium and the like, which may result in a significant modification of the molecular structure and thus may result in a relaxation of the initial intrinsic stress level. Consequently, the layer 120 may still provide a desired tensile strain component in the transistor 150A, while the layer 130 formed above the transistor 150B may compensate for or over-compensate for the tensile stress component of the layer 120. Thereafter, if desired, any further strain-inducing dielectric materials may be deposited if considered advantageous.

Figure 1H:
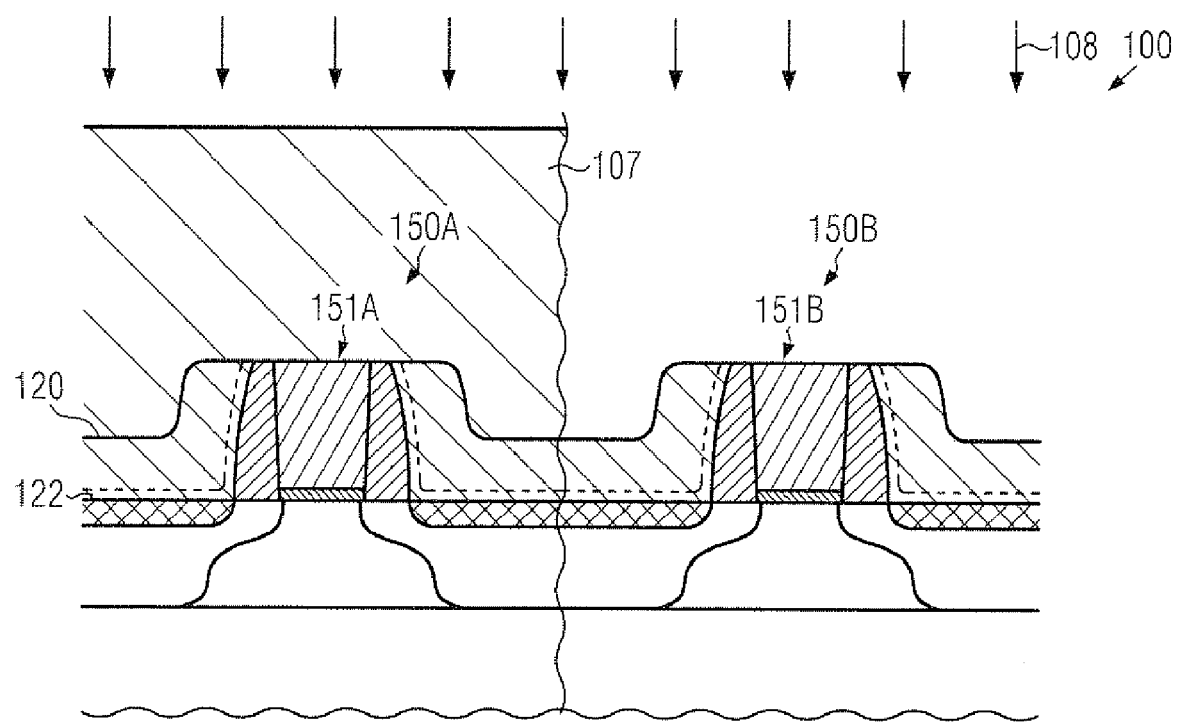
FIG. 1h schematically illustrates the semiconductor device according to still further illustrative embodiments in which the tensile stressed dielectric material, after refilling the gate electrode structures, may be selectively treated in order to reduce the effect of this material on one type of transistor.

FIG. 1h schematically illustrates the semiconductor device 100 according to further illustrative embodiments in which the effect of the layer 120 on the transistor 150b may be reduced. For this purpose, a mask 107, such as a resist mask or any other appropriate mask material, may be provided so as to cover the transistor 150A while exposing the transistor 150B. Based on the mask 107, in some embodiments, a process 108 may be applied in order to selectively reduce or relax the intrinsic stress level of the layer 120, for instance by using an ion bombardment and the like. Consequently, upon providing a further stress-inducing dielectric material, such as the layer 130 (FIG. 1g), a very efficient strain-inducing mechanism may be implemented in the transistor 150B due to the stress relaxation in the exposed portion of the layer 120. In other illustrative embodiments, the process 108 may represent an etch process for selectively removing the exposed portion of the layer 120, which may be accomplished, for example, on the basis of an etch stop layer 122, such as a silicon dioxide material and the like, thereby enabling superior process control of the etch process 108. Consequently, after the removal of the exposed portion of the layer 120 selectively from above the transistor 150B, a compressively stressed dielectric material such as the layer 130 (FIG. 1g) may be deposited so as to be in close contact to the transistor 150B. If desired, this additional compressively stressed dielectric material may be relaxed selectively above the transistor 150A, as is, for instance, previously described with reference to the layer 130, while in other cases this portion may be removed, for instance by providing an etch stop material prior to depositing the compressively stressed material and/or by performing a time controlled etch process. Consequently, also in this case, an efficient dual stress liner approach may be applied for an efficient strain patterning for the transistors 150A, 150B.

As a result, the present disclosure provides semiconductor devices and manufacturing techniques in which the deposition conditions upon replacing a placeholder material of sophisticated gate electrode structures may be enhanced by generating a substantially continuously tapering configuration of an opening obtained after the removal of the placeholder material. To this end, a tensile stressed dielectric material may be provided laterally adjacent to the gate electrode structure, which may, in some illustrative embodiments, also be used for obtaining a tensile strain component in one type of transistor, such as N-channel transistors. On the other hand, the strain level in other transistors, such as P-channel transistors, may be adjusted on the basis of a compressively stressed dielectric material, which is thus applied after refilling the gate electrode structures with an appropriate metal species. Consequently, deposition-related irregularities in sophisticated replacement gate approaches may be reduced or substantially avoided while nevertheless providing an efficient strain-inducing mechanism for transistors of different conductivity type.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a tensile-stressed dielectric layer above and adjacent to a first gate electrode structure of a first transistor and a second gate electrode structure of a second transistor, said first and second gate electrode structures comprising a placeholder material;
    removing a first portion of said tensile-stressed dielectric layer above said first and second gate electrode structures so as to expose a top surface of said placeholder material, while maintaining a second portion of said tensile-stressed dielectric layer laterally adjacent to said first and second gate electrode structures;
    replacing said placeholder material with one or more metal materials in said first and second gate electrode structures in the presence of said second portion; and
    forming a compressively stressed dielectric layer above said second gate electrode structure after replacing said placeholder material.

2. The method of claim 1, further comprising forming a fill material above said tensile-stressed dielectric layer and wherein said top surface of said placeholder material is exposed by removing a portion of said fill material.

3. The method of claim 2, further comprising removing said fill material at least from said second transistor prior to forming said compressively stressed dielectric layer.

4. The method of claim 1, further comprising removing said tensile-stressed dielectric layer selectively from above said second transistor prior to forming said compressively stressed dielectric material.

5. The method of claim 1, further comprising reducing an intrinsic stress level of said tensile-stressed dielectric layer selectively above said second transistor prior to forming said compressively stressed dielectric layer.

6. The method of claim 1, further comprising removing said compressively stressed dielectric layer selectively from above said first transistor.

7. The method of claim 1, further comprising modifying an intrinsic stress level of said compressively stressed dielectric layer selectively above said first transistor.

8. The method of claim 7, wherein modifying said intrinsic stress level comprises performing an ion implantation process so as to reduce said compressive stress level.

9. The method of claim 7, wherein modifying said intrinsic stress level comprises exposing said compressively stressed dielectric layer to UV radiation selectively above said first transistor.

10. The method of claim 2, wherein said fill material is formed so as to have an intrinsic tensile stress.

11. The method of claim 1, further comprising forming drain and source regions of said first and second transistors prior to replacing said placeholder material.

12. A method, comprising:
    forming a tensile-stressed dielectric material so as to laterally enclose a gate electrode structure of a transistor and to expose a top surface of a placeholder material of said gate electrode structure;
    removing said placeholder material in the presence of said tensile-stressed dielectric material so as to form a tapered opening in said gate electrode structure;
    filling said opening with one or more materials, at least one of said one or more materials representing a metal-containing electrode material; and
    reducing a strain-inducing effect of said tensile-stressed dielectric material on said transistor.

13. The method of claim 12, wherein reducing a strain-inducing effect of said tensile-stressed dielectric material comprises forming a compressively stressed dielectric material above said transistor.

14. The method of claim 12, wherein reducing a strain-inducing effect of said tensile-stressed dielectric material comprises relaxing said tensile stress in said tensile-stressed dielectric layer.

15. The method of claim 12, wherein reducing a strain-inducing effect of said tensile-stressed dielectric material comprises reducing an initial tensile stress level in said tensile-stressed dielectric material and forming a compressively stressed dielectric material.

16. The method of claim 12, wherein reducing a strain-inducing effect of said tensile-stressed dielectric material comprises removing said tensile-stressed dielectric material and forming a compressively stressed dielectric material above said transistor.

17. The method of claim 12, wherein forming said tensile-stressed dielectric material comprises depositing a first dielectric layer above said transistor, forming a second dielectric layer above said first dielectric layer and planarizing a surface topography on the basis of said first and second dielectric layers.

18. The method of claim 17, wherein at least said first dielectric layer is provided with an intrinsic tensile stress level.

19. The method of claim 17, wherein at least said second dielectric layer is provided with an intrinsic stress level.

* * * * *